United States Patent [19]

Matsuoka

[11] Patent Number: 4,832,610

[45] Date of Patent: May 23, 1989

[54] IC PACKAGE EXTRACTING MECHANISM USED IN IC SOCKET

[75] Inventor: Noriyuki Matsuoka, Tokyo, Japan

[73] Assignee: Yamaichi Electric Mfg. Co., Ltd., Tokyo, Japan

[21] Appl. No.: 63,656

[22] Filed: Jun. 18, 1987

[30] Foreign Application Priority Data

Jun. 23, 1986 [JP] Japan ................................. 61-146380

[51] Int. Cl.⁴ ............................................... H05K 1/00
[52] U.S. Cl. ...................................... 439/68; 439/152; 439/159
[58] Field of Search .................. 439/55, 64, 68, 69, 439/70, 71, 72, 73, 525, 526, 923, 152, 153, 155, 157, 159, 160, 260, 296, 264, 325, 330, 331; 324/158 R, 158 F

[56] References Cited

U.S. PATENT DOCUMENTS

| | | | |
|---|---|---|---|
| 4,031,295 | 6/1977 | Rigazio | 439/160 |
| 4,498,047 | 2/1985 | Hexamer et al. | 439/152 |
| 4,623,208 | 11/1986 | Kerul et al. | 439/71 |
| 4,669,796 | 6/1987 | Carter | 439/71 |

FOREIGN PATENT DOCUMENTS 2119173 11/1983 United Kingdom ................. 439/71

*Primary Examiner*—David Pirlot
*Attorney, Agent, or Firm*—Wenderoth, Lind & Ponack

[57] ABSTRACT

An IC package extracting mechanism used in an IC socket is disclosed. The socket has a socket substrate including an IC package accommodation section, and a contact for a contacting a terminal of the IC package which is accommodated in the IC package accommodating section. The socket includes a seesaw lever for pushing up the IC package. The seesaw lever has at its one end an IC package push-up lever portion disposed below the IC package accommodated in the IC package accommodation section and at its other end a push-down lever position. The IC package push-up lever portion and the push-down lever portion are able to move up and down in a seesaw motion balancing on a support disposed at the center between the portions. The socket substrate is provided with push-down means for applying push-down force to the push-down lever portion. The push-down means pushes down the push-down lever portion to move the IC package push-up lever portion up, so that the IC package will be pushed up.

4 Claims, 9 Drawing Sheets

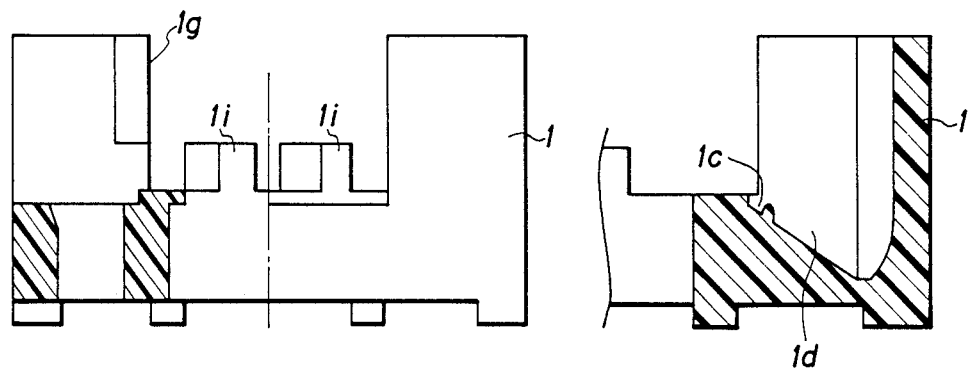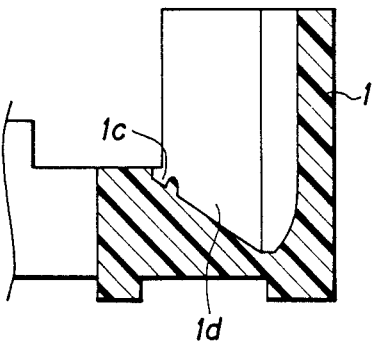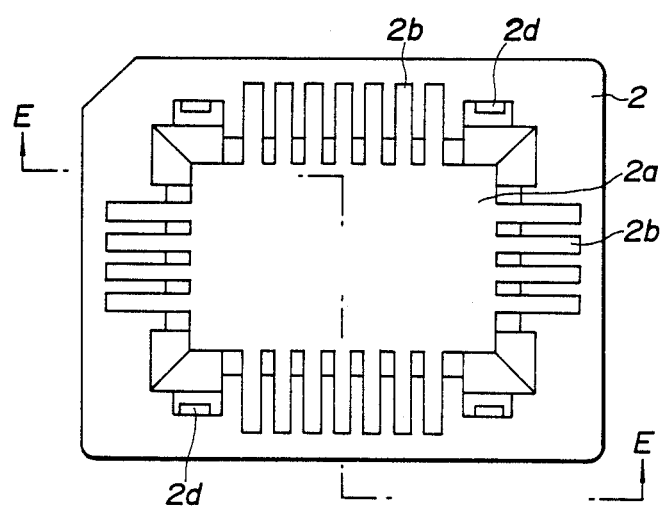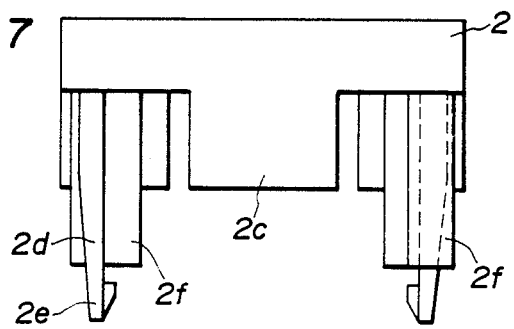

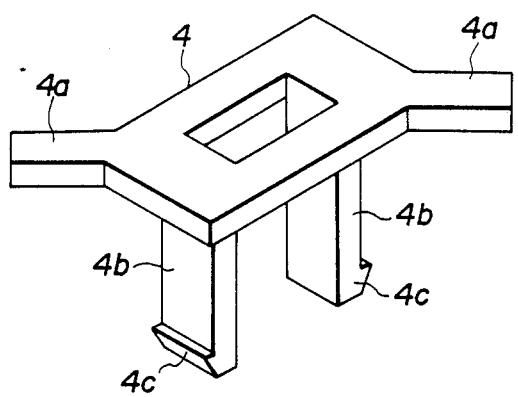
FIG. 10
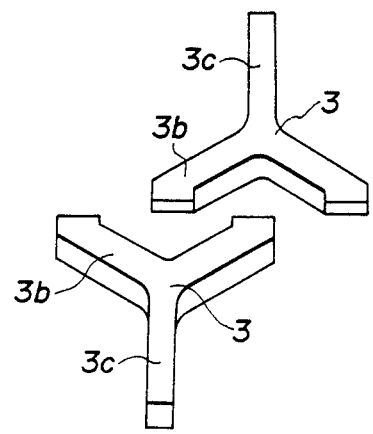
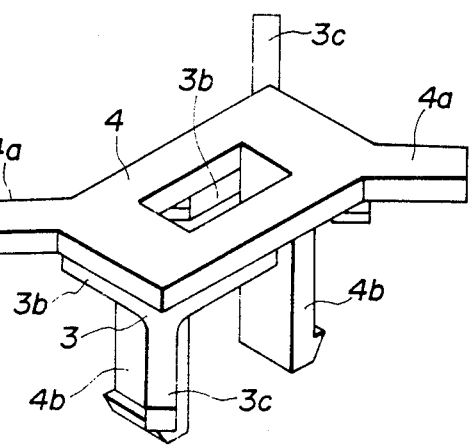
FIG. 11

IC PACKAGE EXTRACTING MECHANISM USED IN IC SOCKET

BACKGROUND OF THE INVENTION

This invention relates to an IC package extracting mechanism used in an IC socket by which an IC package can be easily removed from an IC socket.

There has been known the so-called zero insertion socket in which an IC socket is provided with a discontacting mechanism for a contact which contacts with a contacting element or terminal of an IC package. However, in the case where the IC package is minute and flat, it is difficult to remove the IC package from the IC socket even when the contact resistance becomes zero because it has few portions which can be grasped. If a pincette or the like is used for the removal, there is a possibility that the contact will damaged by mistake. Besides, adoption of a pincette or the like badly spoils the efficiency of the removing step.

In one conventional IC package removing device, for example, a socket is provided with a sink-and-float table for mounting thereon an IC package and held by a spring so that the IC package will be pushed up so it can be removed from the socket. However, since a pushing-up force is normally applied to the IC package by the spring, the IC package tends to be floated even if it is pressed by a pressure cover and its position is thus unstable. In addition, since the amount of pushing-up is limited, a large amount of pushing-up is difficult to obtain and designing of the spring strength, amount of expansion, or the like is difficult.

There has been also known another IC package removing device in which a cover for pressing an IC package is provided with a suction cup member so that the engagement of the the suction cup with the upper surface of the IC package enables extraction of the IC package upon opening of the cover. However, it takes much time and labor to remove the IC package from the suction cup. On the contrary, if the suction force is too small, the IC package tends to come off. In addition, there is an inconvenience that the suction cup deteriorates so that it is no longer firmly attached to the IC package.

The present invention was accomplished in order to eliminate the above-described inconveniences inherent in the conventional devices.

SUMMARY OF THE INVENTION

It is therefore a general object of the present invention to provide an IC package extracting mechanism used in an IC socket by which an IC package can be always easily and surely pushed up and a suitable amount of pushing-up is obtainable to facilitate the extraction of the IC package without the occurrence of the above-described problems.

As means for achieving the above object, a substrate forming an IC socket is provided with a seesaw lever, an IC package is supported by a push-up lever portion which performs a seesaw motion at one end of the seesaw lever, the push-up lever portion being surged up by a force for pushing down a push-down lever portion which performs a seesaw motion at the other end of the seesaw lever to push up the IC package from a contacting position to a discontacted position thereabove so that the IC package can be easily removed.

BRIEF DESCRIPTION OF THE DRAWINGS

The above and other objects, features and advantages of the present invention will become apparent from the following detailed description of a preferred embodiment of the invention with reference to the accompanying drawings, in which:

FIG. 4 is a sectional view taken on the line C—C of FIG. 3;

FIG. 5 is a sectional view taken on the line D—D of FIG. 3;

FIG. 6 is a plan view of the IC package accommodating framework;

FIG. 7 is a side view thereof;

FIG. 10 is an exploded perspective view of an IC package mounting table and a seesaw lever;

FIG. 11 is a perspective view thereof when they are assembled;

DETAILED DESCRIPTION OF THE EMBODIMENT

One preferred embodiment of the present invention will be described hereinafter with reference to the accompanying drawings.

Figure 13:
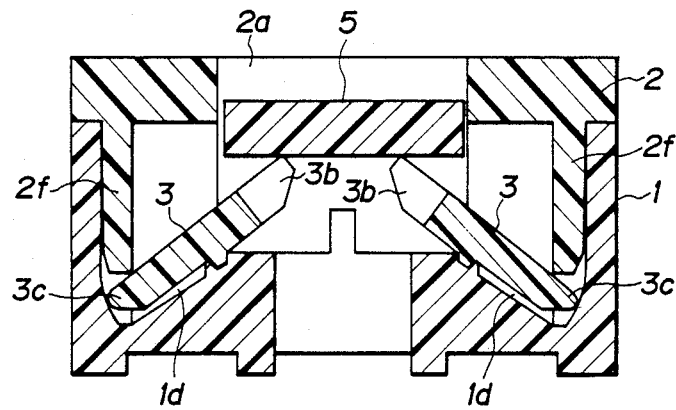
FIG. 13(A) is a sectional view of a socket showing a pushed-up state of an IC package according to a second embodiment of the present invention.
FIG. 13(B) is likewise a sectional view of the socket showing a pushed-down state of the IC package.
Figure 13:
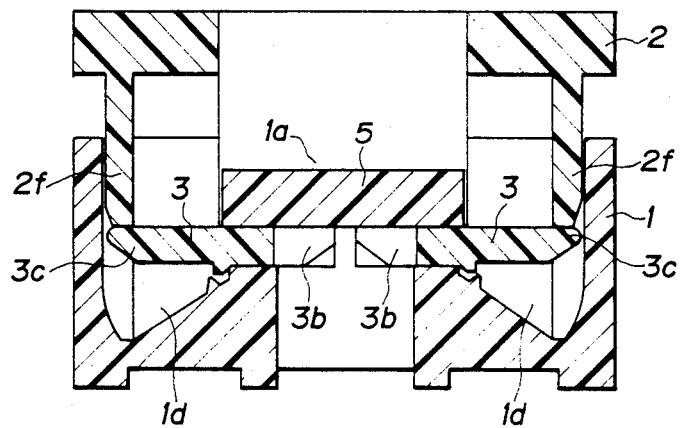
Figure 14:
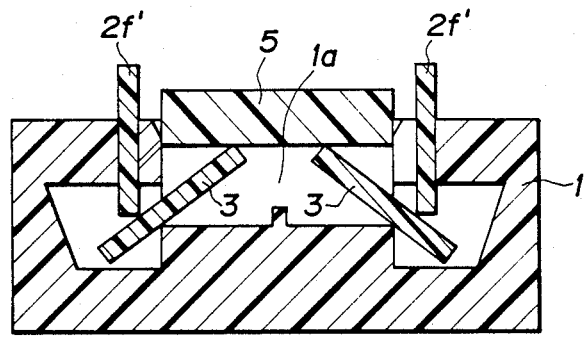
FIG. 14(A) is a sectional view of a socket showing a pushed-up state of an IC package according to a third embodiment of the present invention.
FIG. 14(B) is likewise a sectional view of the socket showing a pushed-down state of the IC package.
Figure 14:
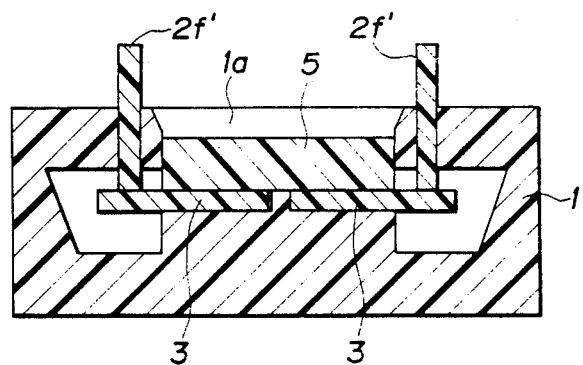

FIGS. 1 through 12 illustrate a first embodiment, FIG. 13 illustrates a second embodiment, and FIG. 14 illustrates a third embodiment.

Referring first to FIGS. 1 through 12, 1 denotes a socket substrate, 2 denotes a framework, 3 denotes a seesaw lever, and 4 denotes an IC package mounting table.

Figure 1:
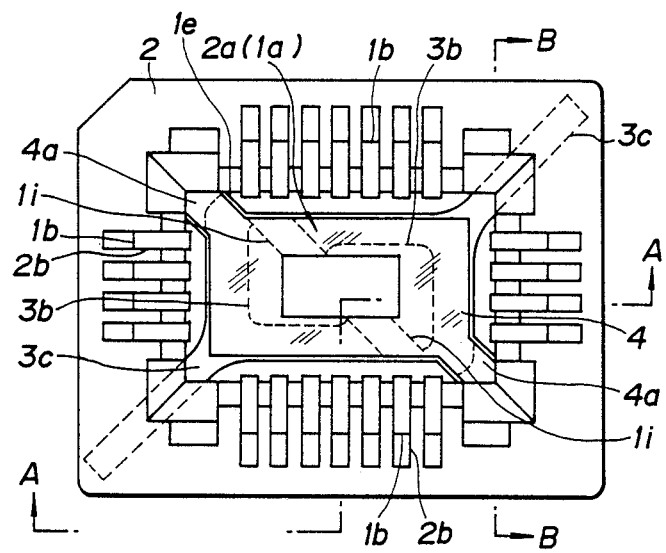
FIG. 1 is a plan view of an IC socket according to one embodiment of the present invention.
Figure 2A:
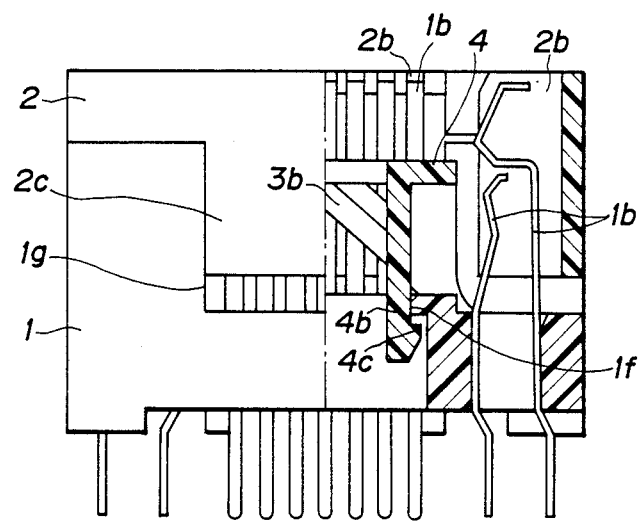
FIG. 2(A) is a sectional view taken along the line A—A of FIG. 1 showing a pushed-up state of an IC package.
Figure 2:
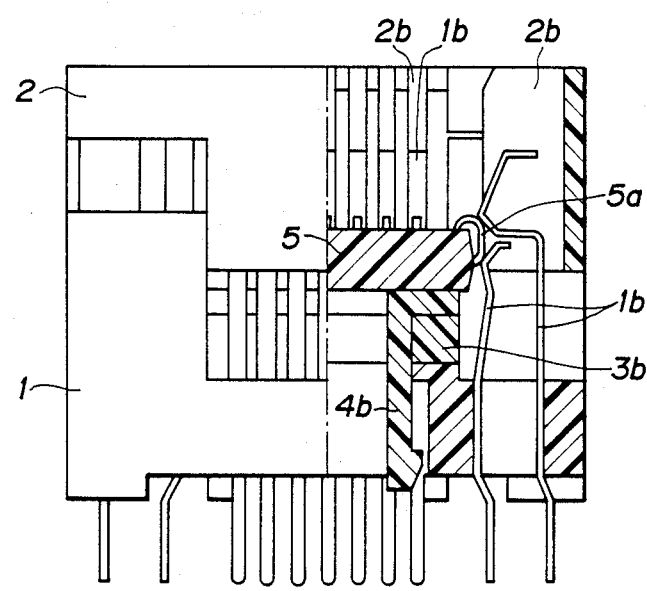
FIG. 2(B) is a sectional view likewise taken along the line A—A of FIG. 1 showing a pushed-down state of the IC package.
FIG. 2(C) is a sectional view taken along the line B—B of FIG. 1 showing a pushed-up state of an IC package accommodating framework.
FIG. 2(D) is a sectional view likewise taken along the line B—B of FIG. 1 showing a pushed-down state of the IC package accommodating framework.
Figure 2:
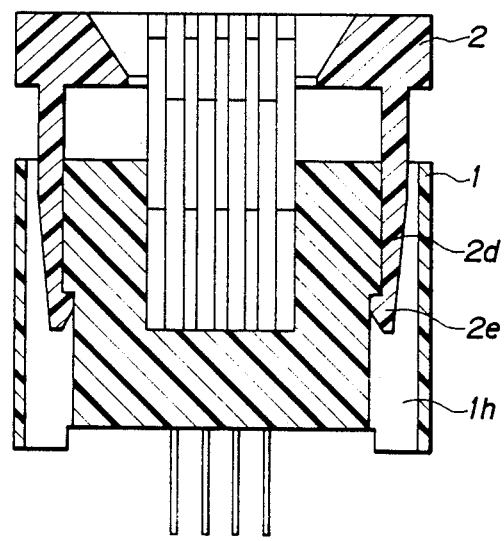
Figure 2D:
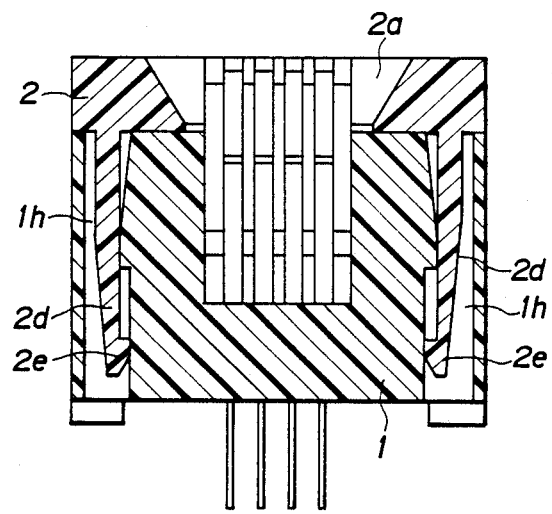
Figure 3:
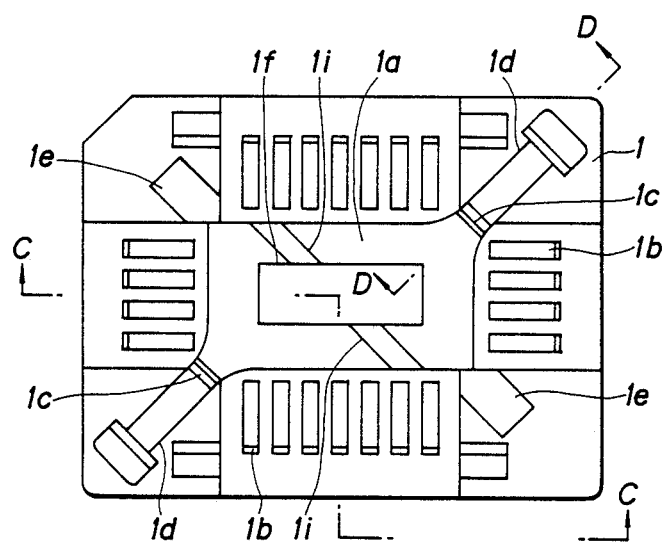
FIG. 3 is plan view of a socket substrate according to one embodiment of the present invention.
Figure 8:
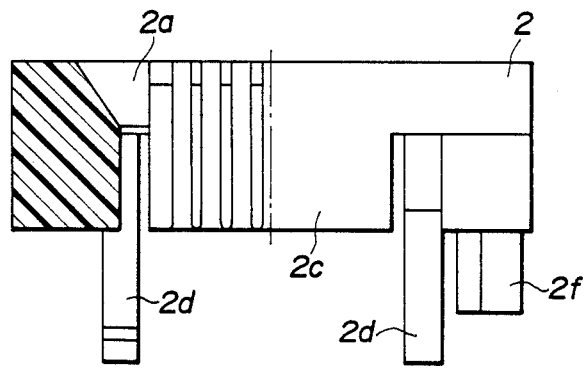
FIG. 8 is a sectional view taken along the line E—E of FIG. 6.
Figure 9:
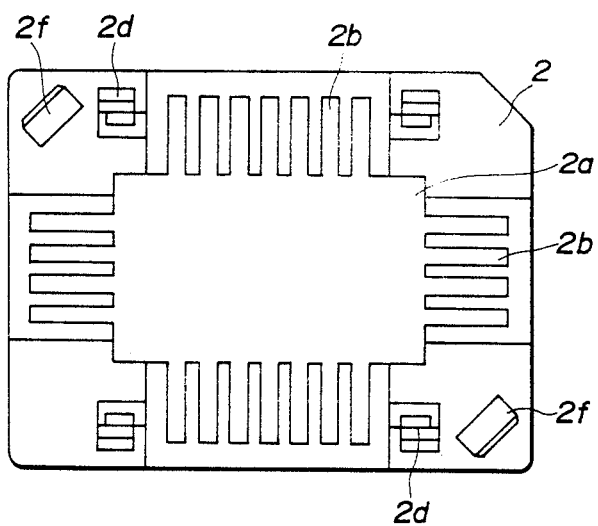
FIG. 9 is a rear view thereof.
Figure 12:
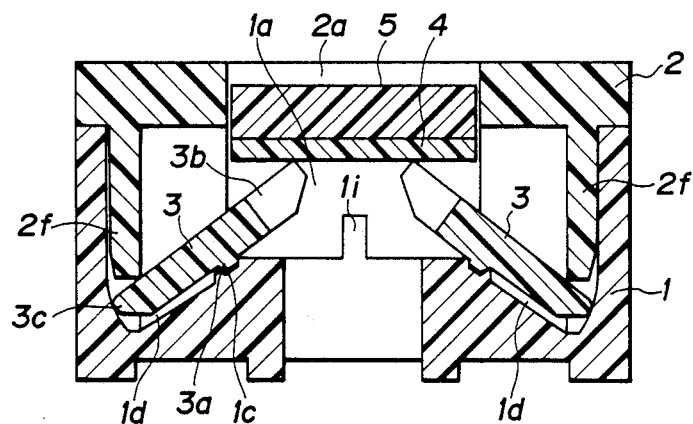
FIG. 12(A) is a sectional view of a socket showing a pushed-up state of the IC package.
FIG. 12(B) is a sectional view of the socket showing a pushed-down state of the IC package.
Figure 12:
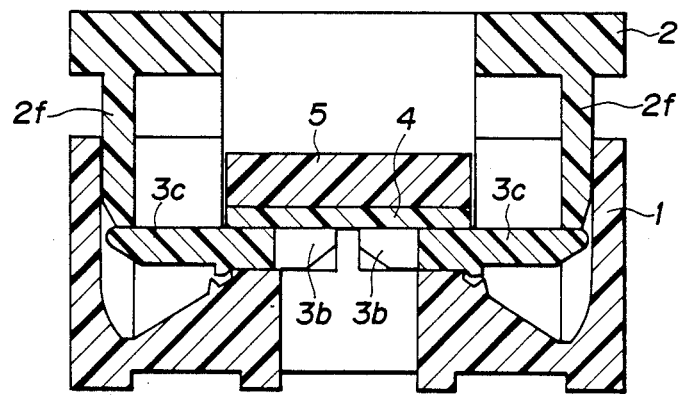

FIGS. 3 through 5 show the structure of the socket substrate 1, FIGS. 6 through 9 show the structure of the IC package accommodating framework 2, and FIGS. 10 and 11 show the structures of the seesaw lever 3 and the IC package mounting table 4. FIGS. 1 and 2 show the assemblies of the above-mentioned various component elements.

The socket substrate 1 is provided at the central portion thereof with a generally square-shaped IC package accommodating section 1a and around the entire periphery or along the two sides of the IC package accommodating section 1a with a plurality of contacts 1b which are to be contacted with a plurality of terminals (5a) of an IC package (5). The socket substrate 1 is also provided with the seesaw lever 3 for seesaw movement at every corner of the IC package accommodating section 1a where the rows of the contacts 1b are not formed.

The seesaw lever 3 includes an IC package push-up lever portion 3b extending inside the IC package accommodating section 1a along the sides forming the corner thereof, and a push-down lever portion 3c extending outside of the IC package accommodating section 1a from the corner. The seesaw lever 3 is provided on the central portion thereof with a projection 3a which is to be snugly engaged into an engaging groove 1c which is formed in the corner portion of the IC package accommodating section 1a, so that the push-up lever portion 3b and the push-down lever portion 3c are moved up and down in turn balancing on the snugging portion as the support thereof.

The corner portion of the IC package accommodating section 1a provided with the seesaw lever 3 is formed with a seesaw lever guiding groove 1d directing outside of the corner along the generally diagonal line thereof. The bottom surface of the guiding groove 1d is inclined downwards in the external direction from the engaging groove 1c serving as the support, so that the push-down lever 3c is permitted to be pushed down when the push-down lever 3c is engaged in the guiding groove 1d.

A pair of seesaw levers 3 are disposed on one diagonal line of the IC package accommodating section 1a, one on each corner. The IC package accommodating section 1a is provided on its bottom surface with a partition wall 1i for separating the two seesaw levers 3 in order to prevent the respective seesaw levers from shifting within the IC package accommodating section 1a.

Within the IC package accommodating section 1a with the seesaw levers 3 disposed as described, the IC package mounting table 4 of a generally same shape as the IC package accommodating section 1a is contained, and the corner portions of the mounting table (4) are superposed on the upper surfaces of the lever portions 3b. By this, one seesaw lever 3 supports on the push-up lever portion 3b thereof the area along one side forming the corner of the IC package mounting table 4, while the other seesaw lever 3 supports the area along the other side forming the corner of the IC package mounting table 4. The seesaw motion of the seesaw levers 3 causes the IC package mounting table 4 to move up and down. More specifically, the push-up lever portion 3b is moved up by pushing down the push-down lever portion 3c of the seesaw lever 3 thereby to push up both ends of the IC package mounting table 4 and an IC package 5 mounted thereon to bring them to the discontacting position (see FIG. 15(A)), and, on the contrary, the IC package mounting table 4 is lowered by pushing down the IC package 5 thereby to turn the push-up lever portions 3b downwards to move the push-down lever portions 3c up to bring them to the contact position (see FIG. 12(B)).

In order to have the IC package mounting table perform the vertical movement smoothly, a guiding piece 4a projecting sidewards from a pair of corner portions on the diagonal line of the IC package mounting table 4 is snugly engaged in a guiding groove 1e formed in the external direction from the corner portions on the diagonal line of the IC package accommodating section 1a.

A plurality of legs 4b extend downwards from the IC package mounting table 4, and the legs 4b are inserted along the inner wall of a window 1f formed in the central portion of the IC package accommodating section 1a, so that when the IC package mounting table 4 is lifted up, hooks 4c formed on the outside of the ends of the legs 4b are engaged with the peripheral portion of the wall defining the window 1f to regulate the amount of lifting thereof and to prevent the same from coming off.

The framework 2 is provided on the socket substrate 1 which is formed as described above.

The framework 2 has an opening 2a directly above the IC package accommodating section 1a of the socket substrate 1. The opening 2a has formed at four sides or two sides thereof a plurality of contact accommodating grooves 2b. By placing the framework 2 on the socket substrate 1, the IC package accommodating section 1a and the opening 2a are brought to positions vertically corresponding to each other, and the contacts 1b are inserted in the contact accommodating grooves 2b.

In order to hold the framework 2, a depending guiding piece 2c is formed on each side wall of the framework 2, and the guiding piece 2c is snugly engaged in a guiding groove 1g formed in the side wall of the socket substrate 1 to set the position of the framework 2, and the vertical movement is limited by this as a guide.

Furthermore, a plurality of legs 2d extend downwards from the framework 2, and the legs 2 are inserted into guiding holes 1h formed in the socket substrate 1 and serve as a guide for vertical movement, and a hook 2e formed on the inside end of each leg 2d is engaged with an undercut in the wall when lifting to limit the lifting.

Furthermore, as means for providing a push-down force to the push-down lever portion of the seesaw lever 3, push-down fingers 2f extend downwards from the framework 2 into contact with the upper surface of the end portion of the push-down lever portion 3c.

As is shown in FIG. 12(A), when the IC package (5) is loaded or removed, the framework 2 is in a pushed-down state. As a result, each push-down finger 2f pushes and turns the corresponding push-down lever portion 3c to urge the push-up lever portion 3b, up thereby to hold the IC package mounting table 4 in its lifted position.

In the above-mentioned state, the IC package 5 is mounted on the IC package mounting table 4 there is applied the latter a push-down force. As a result, as is shown in FIG. 12(B), the IC package mounting table 4 turns the push-up lever portion 3b of the seesaw lever 3b downwards, and moves the push-down lever portion 3c up and, at the same time, pushes up the push-down finger 2f of the framework 2 to bring the framework 2 to the pushed-up position.

In the this state, terminals 5a arranged on each side of the IC package 5 are resiliently caught from both sides thereof and contacted under pressure by the contacts 1b. That is, the contacts are brought into contact with each other.

When the framework 2 is pushed down from the contacting state, each seesaw lever 3 performs the seesaw motion as described. As a result, the IC package mounting table 4 and the IC package 5 mounted thereon are pushed up again to the lifted-position shown in FIG. 12(A) to move contacts 5a out of the contacted state. In this state, the IC package 5 can be easily removed from and mounted on the IC package mounting table 4.

Referring now to FIGS. 13A and 13B, a second embodiment of the present invention will be described. In the illustrated embodiment, there is no IC package mounting table 4 like that used in the first embodiment, and the IC package 5 is directly supported by the push-up lever portion 3b of each seesaw lever 3. By seesaw motion of the seesaw levers 3, the lower contacting position shown in FIG. 13(A) and the IC package pushed-up position shown in FIG. 13(B) are obtained.

Referring to FIGS. 14A and 14B, a third embodiment of the present invention will be described. In the illustrated embodiment, there is no framework 2 such as is used in the first embodiment, but rather push-down fingers 2f' are vertically operatably mounted on the socket substrate 1. The front end of each push-down finger 2f' is abutted against and pushes down the push-down lever portion 3c of a seesaw lever 3. The pushing down of the push-down portion 3c of the seesaw lever 3 causes the IC package push-up lever portion of the seesaw lever 3 to move up to the IC package pushed-up position shown in FIG. 14(A). On the contrary, the pushing down of the IC package causes the push-down fingers 2f' to move to the pushed-up position shown in FIG. 14(B).

In the above-described embodiment, the IC package mounting table 4 may of course be used. Furthermore, the push-down finger 2f' and the end portion of the push-down lever portion 3c of the seesaw lever 3 are contacted with each other as described. In the above-described embodiments, the push-down finger (25) or (25') and the seesaw lever (3) may be linked with each other by a shaft.

As described in the foregoing, a socket substrate is provided with a seesaw lever, an IC package is supported by a push-up lever portion which performs a seesaw motion at one end of the seesaw lever, the push-up lever portion being moved up by applying force for pushing down a push-down lever portion which performs a seesaw motion at the other end of the seesaw lever to push up the IC package. Accordingly, the IC package is always easily and surely pushed up in association with the seesaw motion of the seesaw lever and pushed up to a high position by a predetermined amount, thereby to facilitate the removal of the IC package.

Furthermore, the distance the IC package is pushed up can be optionally set by setting the amount of seesaw motion of the seesaw lever. Besides, the setting can be easily and satisfactorily performed. Accordingly, it is very easy to manufacture.

From the foregoing description of the preferred embodiments of the present invention with reference to the accompanying drawings, various modification and changes in construction will easily occur to those having ordinally knowledge in the art and furthermore, the present invention may be embodied in substantially similar modes which fulfill substantially the same object and attain substantially the same effects as those described in connection with the preferred embodiments.

What is claimed is:

1. An IC socket having a mechanism for extracting an IC package therefrom, comprising:

a socket substrate having an IC package accommodation section for receiving an IC package in an accommodating position when moved from a position outside said accommodation section into said accommodation section, and contact means for contacting terminal means of an IC package when said IC package is in the accommodating position;

lever means comprising a lever pivotally disposed within said socket substrate and pivotable on said socket substrate around a pivot point intermediate the ends of said lever for pushing an IC package out of said accommodating position, said lever having a push-up lever portion and a push-down lever portion, said lever portions being movable alternately up and down around said pivot point as a fulcrum, and said push-up portion extending into said accommodation section for being pushed to a lowermost position by an IC package in the accommodating position therein; and push-down means on said socket substrate and movable from an upper position to a lower position and engaging the push-down lever portion of said lever for pushing the push-down portion of said lever down when said push-down means is pushed down to the lower position, said push-up portion of said lever being moved to an uppermost position by pivoting movement of said lever in which it urges an IC package to a position outside said accommodation section, whereby when an IC package is placed in the position outside said accommodating position and is supported thereat by said push-up portion of said lever, and said IC package is pushed down into the accommodating position, said lever pivots to move said push-down portion up and move said push-down means up, and when said push-down means is pushed down, said lever is pivoted to cause said push-up portion to push the IC package up to the position outside said accommodation section.

2. An IC socket as claimed in claim 1 further comprising an IC package mounting table movable in the vertical direction in and out of said accommodating position while carrying an IC package thereon, said push-up lever portion engaging said IC package mounting table.

3. The invention as claimed in claim 1 wherein said lever is in one side of said accommodation section, and a further lever is provided on a diametrically opposite side of said accommodation section.

4. The invention is claimed in claim 1 further comprising a framework on said socket substrate, said push-down means being movable in said framework.

* * * * *